(12) United States Patent
Ozawa

(10) Patent No.: US 7,680,669 B2
(45) Date of Patent: Mar. 16, 2010

(54) SOUND ENCODING APPARATUS AND METHOD, AND SOUND DECODING APPARATUS AND METHOD

(75) Inventor: Kazunori Ozawa, Tokyo (JP)

(73) Assignee: NEC Corporation, Tokyo (JP)

( * ) Notice: Subject to any disclaimer, the term of this patent is extended or adjusted under 35 U.S.C. 154(b) by 967 days.

(21) Appl. No.: 10/469,923

(22) PCT Filed: Mar. 7, 2002

(86) PCT No.: PCT/JP02/02119

§ 371 (c)(1),
(2), (4) Date: Sep. 5, 2003

(87) PCT Pub. No.: WO02/071394

PCT Pub. Date: Sep. 12, 2002

(65) Prior Publication Data

US 2004/0117178 A1    Jun. 17, 2004

(30) Foreign Application Priority Data

Mar. 7, 2001    (JP) .............................. 2001-063687

(51) Int. Cl.
*G10L 19/00* (2006.01)
(52) U.S. Cl. ....................... 704/500; 704/219
(58) Field of Classification Search ................ 704/219, 704/220, 500–504
See application file for complete search history.

(56) References Cited

U.S. PATENT DOCUMENTS

| | | | | |
|---|---|---|---|---|
| 5,142,584 A | * | 8/1992 | Ozawa | 704/223 |
| 5,826,226 A | * | 10/1998 | Ozawa | 704/223 |
| 5,999,897 A | * | 12/1999 | Yeldener | 704/207 |
| 6,023,672 A | * | 2/2000 | Ozawa | 704/222 |
| 6,041,298 A | * | 3/2000 | Gortz | 704/223 |

(Continued)

FOREIGN PATENT DOCUMENTS

CA    2283187    9/1998

(Continued)

OTHER PUBLICATIONS

M.Schroeder et al., "Code-excited linear prediction: High quality speech at very low bit rates" (Proc. ICASSP, pp. 937-940, 1985.

(Continued)

*Primary Examiner*—Richemond Dorvil
*Assistant Examiner*—Douglas C Godbold
(74) *Attorney, Agent, or Firm*—Sughrue Mion, PLLC

(57) ABSTRACT

A plurality of sets of position code books indicating the pulse position are provided in a multi-set position code book storing circuit (450). In accordance with a pitch prediction signal obtained in an adaptive code book circuit (500), one type of position code book is selected from the plurality of position code books in a position code book selecting circuit (510). From the selected position code book, a position is selected by a sound source quantization circuit (350) so as to minimize distortion of a sound signal. An output of the adaptive code book circuit (500) and an output of the sound source quantization circuit (350) are transferred.

Thus, a sound signal can be encoded while suppressing deterioration of the sound quality with a small amount of calculations even when the encoding bit rate is low.

14 Claims, 4 Drawing Sheets

U.S. PATENT DOCUMENTS

| | | | |
|---|---|---|---|
| 6,141,638 A * | 10/2000 | Peng et al. | 704/211 |
| 6,173,257 B1 | 1/2001 | Gao | |
| 6,188,980 B1 * | 2/2001 | Thyssen | 704/230 |
| 6,243,673 B1 * | 6/2001 | Ohno | 704/207 |
| 6,408,268 B1 * | 6/2002 | Tasaki | 704/220 |
| 6,611,797 B1 * | 8/2003 | Amada et al. | 704/211 |
| 6,795,805 B1 * | 9/2004 | Bessette et al. | 704/223 |
| 2001/0014856 A1 * | 8/2001 | Wuppermann et al. | 704/223 |
| 2002/0007272 A1 | 1/2002 | Ozawa | |
| 2002/0128828 A1 * | 9/2002 | Gao | 704/223 |

FOREIGN PATENT DOCUMENTS

| | | |
|---|---|---|
| CA | 2 271 410 | 11/1999 |
| EP | 0 957 472 A2 | 11/1999 |
| JP | 04-036300 A | 2/1992 |
| JP | 04-171500 A | 6/1992 |
| JP | 05-006199 A | 1/1993 |
| JP | 06-222797 A | 8/1994 |
| JP | 09-281998 A | 10/1997 |
| JP | 10-020889 A | 1/1998 |
| JP | H11-259100 | 9/1999 |
| JP | 11-296195 A | 10/1999 |
| JP | 11-327597 A | 11/1999 |
| JP | H11-327597 | 11/1999 |
| JP | 2002-214900 A | 8/2000 |
| JP | 2001-318698 A | 11/2001 |
| WO | WO 00/00963 A1 | 1/1999 |

OTHER PUBLICATIONS

Kleijn et al., "Improved speech quality and efficient vector quantization in SELP" (Proc. ICASSP, pp. 155-158, 1988).

C. Laflamme et al., "16 kbps wideband speech coding technique based on algebraic CELP" (Proc. ICASSP, pp. 13-16, 1991).

Nakamizo, "Signal Analysis and System Identification" (CORONA, 1988), pp. 82-87.

Sugamura et al., "Speech Data Compression by LSP Speech Analysis-Symthesis Technique" (IECE Trans., J64-A, pp. 599-606, 1981).

T. Nomura et al., "LSP Coding Using VQ-SVQ With Interpolation in 4.075 kbps M-LCELP Speech Coder" (Proc. Mobile Multimedia Communications, pp. B.2.5, 1993).

P. Kroon et al., "Pitch predictors with high temporal resolution" (Proc. ICASSP, pp. 661-664, 1990).

Linde et al., "An algorithm for vector quantization design" (IEEE Trans. Commun., pp. 84-95, Jan. 1980).

\* cited by examiner

SOUND ENCODING APPARATUS AND METHOD, AND SOUND DECODING APPARATUS AND METHOD

BACKGROUND OF THE INVENTION

The present invention relates to a sound encoding apparatus and method of encoding a sound signal with high quality at a low bit rate, and a sound decoding apparatus and method of decoding, with high quality, a sound signal encoded by the sound encoding apparatus and method.

For example, CELP (Code Excited Linear Predictive Coding) described in M. Schroeder and B. Atal, "Code-excited linear prediction: High quality speech at very low bit rates (Proc. ICASSP, pp. 937-940, 1985) (to be referred to as reference 1 hereinafter) and Kleijn et al., "Improved speech quality and efficient vector quantization in SELP" (Proc. ICASSP, pp. 155-158, 1988) (to be referred to as reference 2 hereinafter) is known as a system for efficiently encoding a sound signal.

In this CELP, on the transmitting side, spectral parameters representing the spectral characteristics of a sound signal are extracted by using LPC (Linear Predictive Coding) analysis for each frame (e.g., 20 ms) of the sound signal.

Next, each frame is further divided into subframes (e.g., 5 ms). On the basis of a past sound source signal, parameters (a delay parameter and gain parameter corresponding to the pitch period) in an adaptive code book are extracted for each subframe, thereby performing pitch prediction for a sound signal of the subframe by the adaptive code book.

With respect to the sound source signal obtained by the pitch prediction, an optimum sound source code vector is selected from a sound source code book (vector quantization code book) containing predetermined types of noise signals, and an optimum gain is calculated, thereby quantizing the sound source signal. In the sound source code vector selection, a sound source code vector which minimizes an error electric power between a signal synthesized by the selected noise signal and a residual signal is selected.

After that, an index and gain indicating the type of the selected sound source code vector, the spectral parameters, and the parameters of the adaptive code book are multiplexed by a multiplexer and transmitted.

When an optimum sound source code vector is selected from the sound source code book in the conventional sound signal encoding system as described above, filtering or convolutional operation must be once performed for each code vector. Since this operation is repetitively performed by the number of code vectors stored in the code book, a large amount of calculations is necessary. For example, if the number of bits of the sound code book is B and the number of dimensions is N, letting K be the filter or impulse response length in the filtering or convolutional operation, an operation amount of $N \times K \times 2^B \times 8000/N$ is necessary per sec. As an example, if B=10, N=40, and K=10, an extremely enormous operation amount of 81,920,000 times per sec is necessary.

Various methods have been proposed, therefore, as a method of reducing the amount of calculations required to search for a sound source code vector from the sound source code book. An ACELP (Argebraic Code Excited Linear Prediction) system described in C. Laflamme et al., "16 kbps wideband speech coding technique based on algebraic CELP" (Proc. ICASSP, pp. 13-16, 1991) (to be referred to as reference 3 hereinafter) is one of these methods.

In this ACELP system, a sound source signal is represented by a plurality of pulses, and the position of each pulse is transmitted as it is represented by a predetermined number of bits. Since the amplitude of each pulse is limited to +1.0 or −1.0, the amount of calculations for pulse search can be largely reduced.

In the conventional sound signal encoding systems as described above, high sound quality can be obtained for a sound signal having an encoding bit rate of 8 kb/s or more. However, if the encoding bit rate is less than 8 kb/s, the number of pulses per subframe becomes insufficient. Since this makes it difficult to express a sound source signal with satisfactory accuracy, the quality of the encoded sound deteriorates.

SUMMARY OF THE INVENTION

The present invention has been made in consideration of the problems of the conventional techniques as described above, and has as its object to provide a sound encoding apparatus and method capable of encoding a sound signal while suppressing deterioration of the sound quality with a small amount of calculations even when the encoding bit rate is low, and a sound decoding apparatus and method capable of decoding, with high quality, a sound signal encoded by the sound encoding apparatus and method.

To achieve the above object, a sound encoding apparatus of the present invention is a sound encoding apparatus having spectral parameter calculating means for receiving a sound signal and calculating a spectral parameter, spectral parameter quantizing means for quantizing the spectral parameter calculated by the parameter calculating means and outputting the quantized spectral parameter, impulse response calculating means for converting the output spectral parameter from the spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising position code book storing means for storing a plurality of sets of position code books as sets of positions of the pulses, position code book selecting means for selecting one type of code book from the plurality of sets of position code books on the basis of at least one of the delay and gain of the adaptive code book, the sound source quantizing means calculating distortion of the sound signal by using the impulse pulse response, and quantizing a pulse position by selecting a position at which the distortion is decreased, and multiplexer means for combining an output from the spectral parameter quantizing means, an output from the adaptive code book means, and an output from the sound source quantizing means, and outputting the combination.

Also, a sound encoding apparatus of the present invention is a sound encoding apparatus having spectral parameter calculating means for receiving a sound signal and calculating a spectral parameter, spectral parameter quantizing means for quantizing the spectral parameter calculated by the parameter calculating means and outputting the quantized spectral parameter, impulse response calculating means for converting the output spectral parameter from the spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising position code book storing means for storing a plurality of sets of position code books as sets of positions of the pulses, position code book selecting means for selecting one type of code book from the plurality of sets of position code books on the basis of at least one of the delay and gain of the adaptive code book, the sound source quantizing means reading out a gain code vector stored in a gain code book for each position stored in the position code book selected by the position code book selecting means, quantizing a gain to calculate distortion of the sound signal, and selectively outputting one type of combination of a position and gain code vector by which the distortion is decreased, and multiplexer means for combining an output from the spectral parameter quantizing means, an output from the adaptive code book means, and an output from the sound source quantizing means, and outputting the combination.

Furthermore, a sound encoding apparatus of the present invention is a sound encoding apparatus having spectral parameter calculating means for receiving a sound signal and calculating a spectral parameter, spectral parameter quantizing means for quantizing the spectral parameter calculated by the parameter calculating means and outputting the quantized spectral parameter, impulse response calculating means for converting the output spectral parameter from the spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising position code book storing means for storing a plurality of sets of position code books as sets of positions of the pulses, discriminating means for extracting a feature from the sound signal and discriminating and outputting a mode, position code book selecting means for selecting one type of code book from the plurality of sets of position code books on the basis of at least one of the delay and gain of the adaptive code book, if an output from the discriminating means is a predetermined mode, the sound source quantizing means calculating distortion of the sound signal by using the impulse response with respect to a position stored in the selected code book, if the output from the discriminating means is the predetermined mode, and quantizing a pulse position by selectively outputting a position at which the distortion is decreased, and multiplexer means for combining an output from the spectral parameter quantizing means, an output from the adaptive code book means, an output from the sound source quantizing means, and the output from the discriminating means, and outputting the combination.

A sound decoding apparatus of the present invention is a sound decoding apparatus comprising demultiplexer means for receiving a code concerning a spectral parameter, a code concerning an adaptive code book, a code concerning a sound source signal, and a code representing a gain, and demultiplexing these codes, adaptive code vector generating means for generating an adaptive code vector by using the code concerning an adaptive code book, position code book storing means for storing a plurality of sets of position code books as pulse position sets, position code book selecting means for selecting one type of code book from the plurality of sets of position code books on the basis of at least one of a delay and gain of the adaptive code book, sound source signal restoring means for generating a pulse having a non-zero amplitude with respect to the position code book selected by the code book selecting means by using the codes concerning a code book and sound source signal, and generating a sound source signal by multiplying the pulse by a gain by using the code representing the gain, and synthetic filter means formed by a spectral parameter to receive the sound source signal and output a reproduction signal.

Also, a sound decoding apparatus of the present invention is a sound decoding apparatus comprising demultiplexer means for receiving a code concerning a spectral parameter, a code concerning an adaptive code book, a code concerning a sound source signal, a code representing a gain, and a code representing a mode, and demultiplexing these codes, adaptive code vector generating means for generating an adaptive code vector by using the code concerning an adaptive code book, if the code representing the mode is a predetermined mode, position code book storing means for storing a plurality of sets of position code books as pulse position sets, position code book selecting means for selecting one type of code book from the plurality of sets of position code books on the basis of at least one of a delay and gain of the adaptive code book, if the code representing the mode is the predetermined mode, sound source signal restoring means for generating, if the code representing the mode is the predetermined mode, a pulse having a non-zero amplitude with respect to the position code book selected by the code book selecting means by using the codes concerning a code book and sound source signal, and generating a sound source signal by multiplying the pulse by a gain by using the code representing the gain, and synthetic filter means formed by a spectral parameter to receive the sound source signal and output a reproduction signal.

A sound encoding method of the present invention is a sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising preparing position code book storing means for storing a plurality of sets of position code books as sets of positions of the pulses, the position code book selection step of selecting one type of code book from the plurality of sets of position code books on the basis of at least one of the delay and gain of the adaptive code book, the step of calculating distortion of the sound signal by using the impulse pulse response, and quantizing a pulse position by selecting a position at which the distortion is decreased, in the sound source quantization step, and the multiplexing step of combining an output from the spectral parameter quantization step, an output from the adaptive code book step, and an output from the sound source quantization step, and outputting the combination.

Also, a sound encoding method of the present invention is a sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising preparing position code book storing means for storing a plurality of sets of position code books as sets of positions of the pulses, the position code book selection step of selecting one type of code book from the plurality of sets of position code books on the basis of at least one of the delay and gain of the adaptive code book, the step of reading out a gain code vector stored in a gain code book for each position stored in the position code book selected in the position code book selection step, quantizing a gain to calculate distortion of the sound signal, and selectively outputting one type of combination of a position and gain code vector by which the distortion is decreased, in the sound source quantization step, and the multiplexing step of combining an output from the spectral parameter quantization step, an output from the adaptive code book step, and an output from the sound source quantization step, and outputting the combination.

Furthermore, a sound encoding method of the present invention is a sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising preparing position code book storing means for storing a plurality of sets of position code books as sets of positions of the pulses, the discrimination step of extracting a feature from the sound signal and discriminating and outputting a mode, the position code book selection step of selecting one type of code book from the plurality of sets of position code books on the basis of at least one of the delay and gain of the adaptive code book, if an output from the discrimination step is a predetermined mode, the step of calculating distortion of the sound signal by using the impulse pulse response with respect to a position stored in the selected code book, if the output from the discrimination step is the predetermined mode, and quantizing a pulse position by selectively outputting a position at which the distortion is decreased, in the sound source quantization step, and the multiplexing step of combining an output from the spectral parameter quantization step, an output from the adaptive code book step, an output from the sound source quantization step, and the output from the discrimination step, and outputting the combination.

A sound decoding method of the present invention is a sound decoding method comprising the demultiplexing step of receiving a code concerning a spectral parameter, a code concerning an adaptive code book, a code concerning a sound source signal, and a code representing a gain, and demultiplexing these codes, the adaptive code vector generation step of generating an adaptive code vector by using the code concerning an adaptive code book, preparing position code book storing means for storing a plurality of sets of position code books as pulse position sets, the position code book selection step of selecting one type of code book from the plurality of sets of position code books on the basis of at least one of a delay and gain of the adaptive code book, the sound source signal restoration step of generating a pulse having a non-zero amplitude with respect to the position code book selected in the code book selection step by using the codes concerning a code book and sound source signal, and generating a sound source signal by multiplying the pulse by a gain by using the code representing the gain, and the synthetic filtering step formed by a spectral parameter to receive the sound source signal and output a reproduction signal.

Also, a sound decoding method of the present invention is a sound decoding method comprising the demultiplexing step of receiving a code concerning a spectral parameter, a code concerning an adaptive code book, a code concerning a sound source signal, a code representing a gain, and a code representing a mode, and demultiplexing these codes, the adaptive code vector generation step of generating an adaptive code vector by using the code concerning an adaptive code book, if the code representing the mode is a predetermined mode, preparing position code book storing means for storing a plurality of sets of position code books as pulse position sets, the position code book selection step of selecting one type of code book from the plurality of sets of position code books on the basis of at least one of a delay and gain of the adaptive code book, if the code representing the mode is the predetermined mode, the sound source signal restoration step of generating, if the code representing the mode is the predetermined mode, a pulse having a non-zero amplitude with respect to the position code book selected in the code book selection step by using the codes concerning a code book and sound source signal, and generating a sound source signal by multiplying the pulse by a gain by using the code representing the gain, and the synthetic filtering step formed by a spectral parameter to receive the sound source signal and output a reproduction signal.

DESCRIPTION OF THE PREFERRED EMBODIMENTS

Embodiments of the present invention will be described below with reference to the accompanying drawings.

First Embodiment

Figure 1:
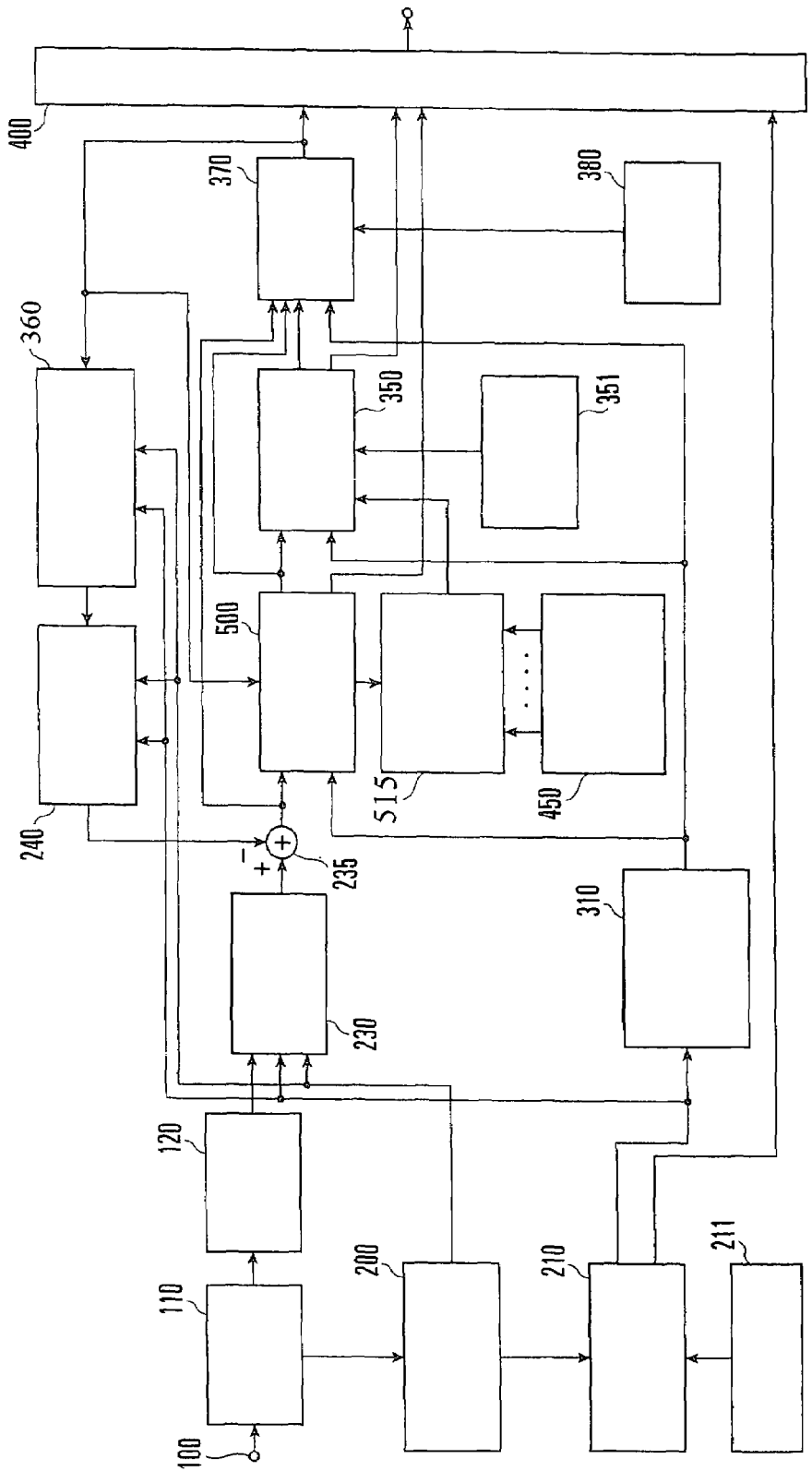
FIG. 1 is a block diagram showing the first embodiment of a sound encoding apparatus of the present invention.

FIG. 1 is a block diagram showing the first embodiment of a sound encoding apparatus of the present invention.

As shown in FIG. 1, this embodiment comprises an input terminal 100, frame dividing circuit 110, spectral parameter calculation circuit 200, spectral parameter quantization circuit 210, LSP code book 211, subframe dividing circuit 120, impulse response calculation circuit 310, hearing sense weighting circuit 230, response signal calculation circuit 240, weighting signal calculation circuit 350, subtracter 235, adaptive code book circuit 500, position code book selecting circuit 510, multi-set position code book storing circuit 450, sound source quantization circuit 350, sound source code book 351, gain quantization circuit 370, gain code book 380, and multiplexer 400.

In the sound decoding apparatus having the above arrangement, a sound signal is input from the input terminal 100 and divided into frames (e.g., 20 ms) by the frame dividing circuit 110. The subframe dividing circuit 120 divides a sound signal of a frame into subframes (e.g., 5 ms) shorter than the frame.

With respect to a sound signal of at least one subframe, the spectral parameter calculation circuit 200 extracts a sound through a window (e.g., 24 ms) longer than the subframe length and calculate a spectral parameter by a predetermined number of orders (e.g., P=10th order). In this spectral parameter calculation, well-known LPC analysis, Burg analysis, or the like can be used. In this embodiment, Burg analysis is used. Detcs of this Burg analysis are described in, e.g., Nakamizo, "Signal Analysis and System Identification" (CORONA, 1988), pp. 82-87 (to be referred to as reference 4 hereinafter). The spectral parameter calculator converts a linear prediction coefficient αI (i=1, . . . , 10) calculated by the Burg method into an LSP parameter suited to quantization or interpolation. This conversion from a linear prediction coefficient into LSP is described in a paper (IECE Trans., J64-A, pp. 599-606, 1981) entitled "Sound Information Compression by Line Spectrum vs. (LSP) Sound Analysis Synthesis System" by Sugamura et al. (to be referred to as reference 5 hereinafter). For example, linear prediction coefficients calculated in the second and fourth subframes by the Burg method are converted into LSP parameters. LSPs in the first and third subframes are calculated by linear interpolation and returned to linear prediction coefficients by inverse transform. Linear prediction coefficients αil (i=1, . . . , 10, l=1, . . . , 5) of the first to fourth subframes are output to the hearing sense weighting circuit 230. Also, the LSP of the fourth subframe is output to the spectral parameter quantization circuit 210.

The spectral parameter quantization circuit 210 efficiently quantizes the LSP parameter of a predetermined subframe, and outputs a quantization value which minimizes distortion represented by $$D_j = \sum_{i=1}^{10} W(i)[LSP(i) - QLSP(i)_j]^2 \qquad (1)$$

where LSP(i), QLSP(i)j, and W(i) are the ith LSP before quantization, jth result after quantization, and weighting coefficient, respectively.

In the following explanation, assume that vector quantization is used as the quantization method, and the LSP parameter of the fourth subframe is quantized. A well-known method can be used as the LSP parameter vector quantization method. For example, practical methods are described in Japanese Patent Laid-Open No. 4-171500 (to be referred to as reference 6 hereinafter), Japanese Patent Laid-Open No. 4-363000 (to be referred to as reference 7 hereinafter), Japanese Patent Laid-Open No. 5-6199 (to be referred to as reference 8 hereinafter), and a paper (Proc. Mobile Multimedia Communications, pp. B.2.5, 1993) entitled "LSP Coding Using VQ-SVQ With Interpolation in 4.075 kbps M-LCELP Speech Coder" by T. Nomura et al. (to be referred to as reference 9 hereinafter). So, an explanation of these methods will be omitted.

On the basis of the LSP parameter quantized in the fourth subframe, the spectral parameter quantization circuit 210 restores the LSP parameters of the first to fourth subframes. In this embodiment, linear interpolation is performed for the quantized LSP parameter of the fourth subframe of a current frame and the quantized LSP of the fourth subframe of an immediately past frame, thereby restoring the LSPs of the first to third subframes. More specifically, after one type of code vector which minimizes an error electric power between the LSP before quantization and the LSP after quantization is selected, the LSPs of the first to fourth subframes can be restored by linear interpolation. To further improve the performance, it is possible to select a plurality of candidates for a code vector which minimizes the error electric power, evaluate the accumulated distortion of each candidate, and select a pair of a candidate and interpolation LSP by which the accumulated distortion is minimized. Detcs are described in, e.g., Japanese Patent Laid-Open No. 6-222797 (to be referred to as reference 10 hereinafter).

Those LSPs of the first to third subframes, which are restored as above and the quantized LSP of the fourth subframe are converted into linear prediction coefficients α'il (i=1, . . . , 10, l=1, . . . , 5) for each subframe, and output to the impulse response calculation circuit 310. Also, an index representing a code vector of the quantized LSP of the fourth subframe is output to the multiplexer 400.

The hearing sense weighting circuit 230 receives the linear prediction coefficients αil (i=1, . . . , 10, l=1, . . . , 5) for each subframe from the spectral parameter calculation circuit 200, performs hearing sense weighting for a sound signal of the subframe on the basis of reference 1, and outputs a hearing sense weighting signal.

The response signal calculation circuit 240 receives the linear prediction coefficients αil for each subframe from the spectral parameter calculation circuit 200, and receives the quantized, interpolated, and restored linear prediction coefficients α'il for each subframe from the spectral parameter quantization circuit 210. By using a saved filer memory value, the response signal calculation circuit 240 calculates a response signal of one subframe by assuming that an input signal is zero, i.e., d(n)=0, and outputs the response signal to the subtracter 235. A response signal $x_z(n)$ is represented by $$x_z(n) = d(n) - \sum_{i=1}^{10} \alpha_i d(n-i) + \sum_{i=1}^{10} \alpha_i \gamma^i y(n-i) + \sum_{i=1}^{10} \alpha'_i \gamma^i x_z(n-i) \quad (2)$$

where if n−i≦0, $x_z(n)$=d(n).

$$y(n-i)=p(N+(n-i)) \quad (3)$$

$$xz(n-i)=sw(N+(n-i)) \quad (4)$$

where N is the subframe length. γ is a weighting coefficient for controlling the hearing sense weighting amount, and has the same value as equation (7) presented below. $s_w(n)$ is an output signal from the weighting signal calculation circuit, and p(n) is an output signal of the denominator of a filter as the first term on the right side of equation (7).

The subtracter 235 subtracts a one-subframe response signal from the sense hearing weighting signal by $$x'w(n)=xw(n)-xz(n) \quad (5)$$

and outputs $x'_w(n)$ to the adaptive code book circuit 500.

The impulse response calculation circuit 310 calculates a predetermined number L of impulse responses $H_w(n)$ of a hearing sense weighting filter whose z conversion is represented by $$H_w(z) = \frac{1 - \sum_{i=1}^{10} \alpha_i z^{-i}}{1 - \sum_{i=1}^{10} \alpha_i \gamma^i z^{-i}} \cdot \frac{1}{1 - \sum_{i=1}^{10} \alpha'_i \gamma^i z^{-i}} \quad (6)$$

and outputs the impulse responses $H_w(n)$ to the adaptive code book 500 and sound source quantization circuit 350.

The adaptive code book circuit 500 receives a past sound source signal v(n) from the gain quantization circuit 370, the output signal $x'_w(n)$ from the subtracter 235, and the hearing sense impulse response $h_w(n)$ from the impulse response calculation circuit 310. The adaptive code book circuit 500 calculates a delay T corresponding to the pitch so as to minimize distortion represented by $$D_T = \sum_{n=0}^{N-1} x'^2_w(n) - \left[\sum_{n=0}^{N-1} x'_w(n)y_w(n-T)\right]^2 \bigg/ \left[\sum_{n=0}^{N-1} y^2_w(n-T)\right] \quad (7)$$

where $$Y_w(n-T)=v(n-T)*h_w(n) \quad (8)$$

and outputs an index representing this delay to the multiplexer 400.

In equation (8), a symbol * represents convolutional operation.

Next, a gain β is calculated by $$\beta = \sum_{n=0}^{N-1} x'_w(n)y_w(n-T) \bigg/ \sum_{n=0}^{N-1} y^2_w(n-T) \quad (9)$$

To improve the delay extraction accuracy for female voices or children's voices, it is also possible to calculate the delay by a decimal sample value, not by an integral sample. A practical method is described in, e.g., a paper (Proc. ICASSP, pp. 661-664, 1990) entitled "Pitch pre-dictors with high temporal resolution" by P. Kroon et al. (to be referred to as reference 11 hereinafter).

Furthermore, the adaptive code book circuit 500 performs pitch prediction in accordance with $$e_w(n)=x'_w(n)-\beta v(n-T)*h_w(n) \quad (10)$$

The multi set position code book storing circuit 450 stores a plurality of sets of pulse position code books in advance. For example, when two sets of position code books are stored, position code books of the individual sets are as shown in Tables 1 and 2.

TABLE 1

| Pulse numbers | Sets of positions |
|---|---|
| 1st pulse | 0, 20, 40, 60 |
| 2nd pulse | 1, 21, 41, 61 |
| 3rd pulse | 2, 22, 42, 62 |
| 4th pulse | 3, 23, 43, 63 |
|  | 4, 24, 44, 64 |
|  | 5, 25, 45, 65 |
|  | 6, 26, 46, 66 |
|  | 7, 27, 47, 67 |
|  | 8, 28, 48, 68 |
|  | 9, 29, 49, 69 |
|  | 10, 30, 50, 70 |
|  | 11, 31, 51, 71 |
|  | . . . . |
|  | . . . . |
|  | . . . . |
|  | 19, 39, 59, 79 |

TABLE 2

| Pulse numbers | Sets of positions |
|---|---|
| 1st pulse | 0, 20, 40, 60 |
| 2nd pulse | 1, 21, 41, 61 |
| 3rd pulse | . . . . |
|  | . . . . |
|  | . . . . |
| 4th pulse | 15, 35, 55, 75 |
|  | 16, 36, 56, 76 |
|  | 17, 37, 57, 77 |
|  | 18, 38, 58, 78 |
|  | 19, 39, 59, 79 |

The position code book selecting circuit 515 receives a pitch prediction signal from the adaptive code book circuit 500 and temporally performs smoothing. For the smoothed signal, the position code book selecting circuit 515 receives the plurality of sets of position code books 450. The position code book selecting circuit 515 calculates correlations with the smoothed signal for all pulse positions stored in each position code book, selects a position code book which maximizes the correlation, and outputs the selected position code book to the sound source quantization circuit 350.

The sound source quantization circuit 350 represents a subframe sound source signal by M pulses.

In addition, the sound source quantization circuit 350 has a B-bit amplitude code book or polar code book for quantizing M pulses of the pulse amplitude. In the following explanation, an operation when a polar code book is used will be described. This polar code book is stored in the sound source code book 351.

The sound source quantization circuit 350 reads out each polar code vector stored in the sound source code book 351. The sound source quantization circuit 350 applies, to each code vector, all positions stored in the position code book selected by the position code book selecting circuit 515, and selects a combination of a code vector and position by which equation (11) below is minimized.

$$D_k = \sum_{n=0}^{N-1} \left[ e_w(n) - \sum_{i=1}^{M} g'_{ik} h_w(n - m_i) \right]^2 \quad (11)$$

where $h_w(n)$ is a hearing sense weighting impulse response.

To minimize equation (11), it is only necessary to obtain a combination of a polar code vector $g_{ik}$ and position $m_i$ by which equation (12) below is maximized.

$$D_{(k,j)} = \left[ \sum_{n=0}^{N-1} e_w(n) s_{wk}(m_i) \right]^2 \bigg/ \sum_{n=0}^{N-1} s^2_{wk}(m_i) \quad (12)$$

This combination may also be so selected as to maximize equation (13) below. This further reduces the operation amount necessary to calculate the numerator.

$$D_{(k,j)} = \left[ \sum_{n=0}^{N-1} \Phi(n) v_k(n) \right]^2 \bigg/ \sum_{n=0}^{N-1} s^2_{wk}(m_i) \quad (13)$$

where (14)

$$\Phi(n) = \sum_{i=n}^{N-1} e_w(i) h_w(i-n), n = 0, \ldots, N-1$$

After completing search for the polar code vector, the sound source quantization circuit 350 outputs the selected combination of the polar code vector and position set to the gain quantization circuit 370.

The gain quantization circuit 370 receives the combination of the polar code vector and pulse position set from the sound source quantization circuit 350. In addition, the gain quantization circuit 370 reads out gain code vectors from the gain code book 380, and searches for a gain code vector which minimizes equation (15) below.

$$D_k = \sum_{n=0}^{N-1} \left[ x_w(n) - \beta'_t v(n-T) * h_w(n) - G'_t \sum_{i=1}^{M} g'_{ik} h_w(n - m_i) \right]^2 \quad (15)$$

In this embodiment, the gain of the adaptive code book and the gain of the sound source represented by pulses are simultaneously subjected to vector quantization. An index indicating the selected polar code vector, a code indicating the position, and an index indicating the gain code vector are output to the multiplexer 400.

Note that the sound source code book may also be stored by learning beforehand by using a sound signal. A code book learning method is described in, e.g., a paper (IEEE Trans. Commun., pp. 84-95, January, 1980) entitled "An algorithm for vector quantization design" by Linde et al. (to be referred to as reference 12 hereinafter).

The weighting signal calculation circuit 360 receives these indices, and reads out a code vector corresponding to each index. The weighting signal calculation circuit 360 calculates a driving sound source signal $v(n)$ on the basis of $$v(n) = \beta'_t v(n-T) + G'_t \sum_{j=1}^{M} g'_{ik} \delta(n - m_i) \quad (16)$$

$v(n)$ is output to the adaptive code book circuit 500.

By using the output parameters from the spectral parameter calculation circuit 200 and the output parameters from the spectral parameter quantization circuit 210, a response signal $s_w(n)$ is calculated for each subframe in accordance with $$s_w(n) = v(n) - \sum_{i=1}^{10} a_i v(n-i) + \sum_{i=1}^{10} a_i \gamma^i p(n-i) + \sum_{i=1}^{10} a_i \gamma^i s_w(n-i) \quad (17)$$

The calculated response signal $s_w(n)$ is output to the response signal calculation circuit 240.

The multiplexer 400 multiplexes the outputs from the spectral parameter quantization circuit 200, adaptive code book circuit 500, sound source quantization circuit 350, and gain quantization circuit 370, and outputs the multiplexed signal to the transmission path.

Second Embodiment

Figure 2:
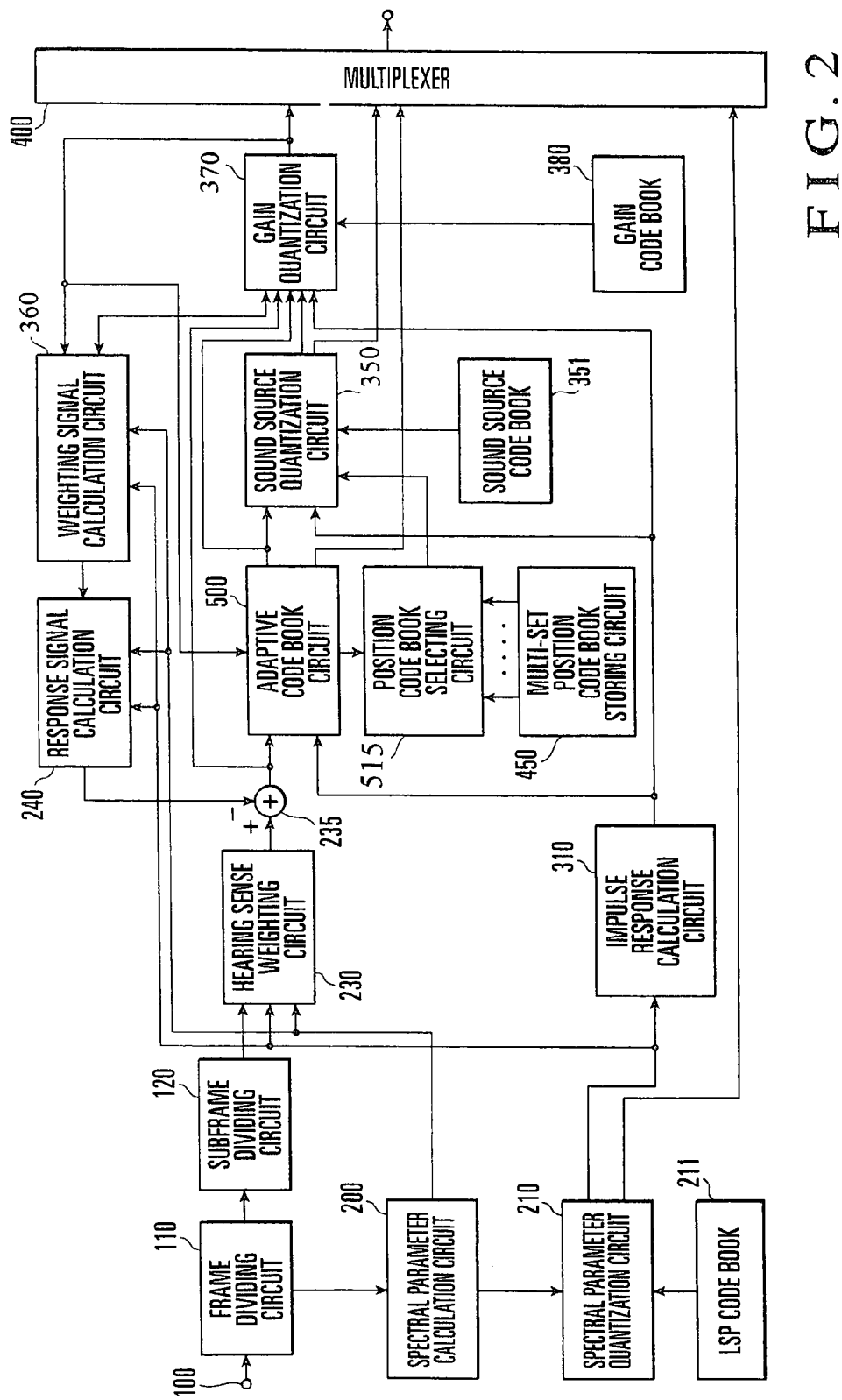
FIG. 2 is a block diagram showing the second embodiment of the sound encoding apparatus of the present invention.

FIG. 2 is a block diagram showing the second embodiment of the sound encoding apparatus of the present invention.

In this embodiment, the same reference numerals as in FIG. 1 denote the same constituent elements, and an explanation thereof will be omitted.

A sound source quantization circuit 357 reads out each polar code vector stored in a sound source code book 351, and applies, to each code vector, all positions stored in one type of position code book selected by a position code book selecting circuit 515. The sound source quantization circuit 357 selects a plurality of sets of combinations of code vectors and position sets by which equation (11) is minimized, and outputs these combinations to a gain quantization circuit 377.

The gain quantization circuit 377 receives the plurality of sets of combinations of polar code vectors and pulse positions from the sound source quantization circuit 377. In addition, the gain quantization circuit 377 reads out gain code vectors from a gain code book 380, and selectively outputs one type of combination of a gain code vector, polar code vector, and pulse position so as to minimize equation (15).

Third Embodiment

Figure 3:
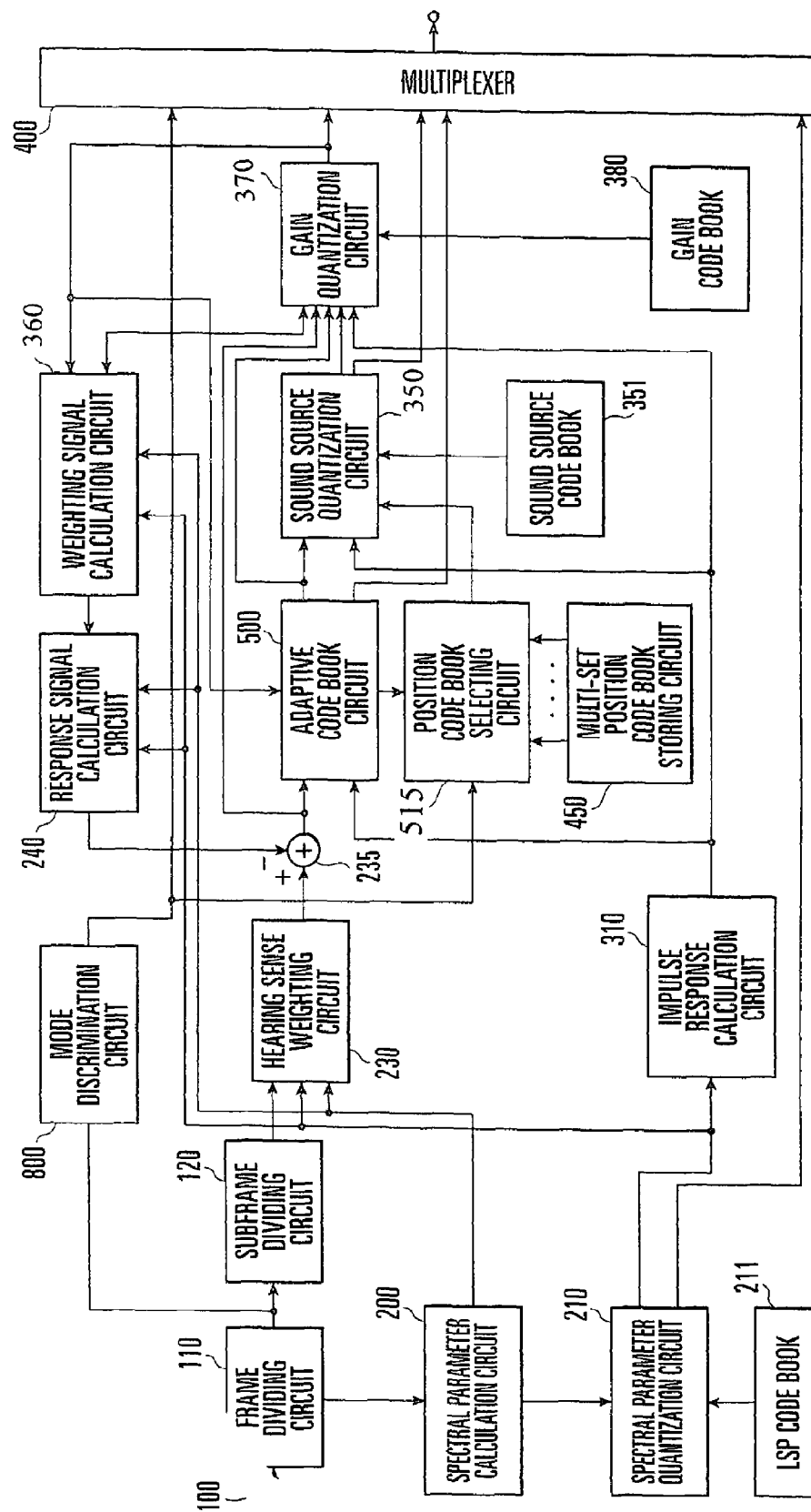
FIG. 3 is a block diagram showing the third embodiment of the sound encoding apparatus of the present invention.

FIG. 3 is a block diagram showing the third embodiment of the sound encoding apparatus of the present invention.

In this embodiment, the same reference numerals as in FIG. 1 denote the same constituent elements, and an explanation thereof will be omitted.

A mode discrimination circuit 800 extracts a feature amount by using an output signal from a frame dividing circuit, and discriminates the mode of each frame. As the feature, a pitch prediction gain can be used. The mode discrimination circuit 800 averages, in the entire frame, the pitch prediction gains obtained for individual subframes, compares the average with a plurality of predetermined threshold values, and classifies the value into a plurality of predetermined modes. Assume, for example, that the number of types of modes is 2 in this embodiment. These modes 0 and 1 correspond to an unvoiced interval and voiced interval, respectively. The mode discrimination circuit 800 outputs the mode discrimination information to a sound source quantization circuit 358, gain quantization circuit 378, and multiplexer 400.

The sound source quantization circuit 358 receives the mode discrimination information from the mode discrimination circuit 800. In mode 1, the sound source quantization circuit 358 receives a position code book selected by a position code book selecting circuit 515, reads out polar code books for all positions stored in the code book, and selectively outputs a pulse position set and polar code book so as to minimize equation (11). In mode 0, the sound source quantization circuit 358 reads out a polar code book for one type of pulse set (e.g., a predetermined one of the pulse sets shown in Tables 1 and 2), and selectively outputs a pulse position set and polar code book so as to minimize equation (11).

The gain quantization circuit 378 receives the mode discrimination information from the mode discrimination circuit 800. The gain quantization circuit 378 reads out gain code vectors from a gain code book 380, searches for a gain code vector with respect to the selected combination of the polar code vector and position so as to minimize equation (15), and selects one type of combination of a gain code vector, polar code vector, and position by which distortion is minimized.

Fourth Embodiment

Figure 4:
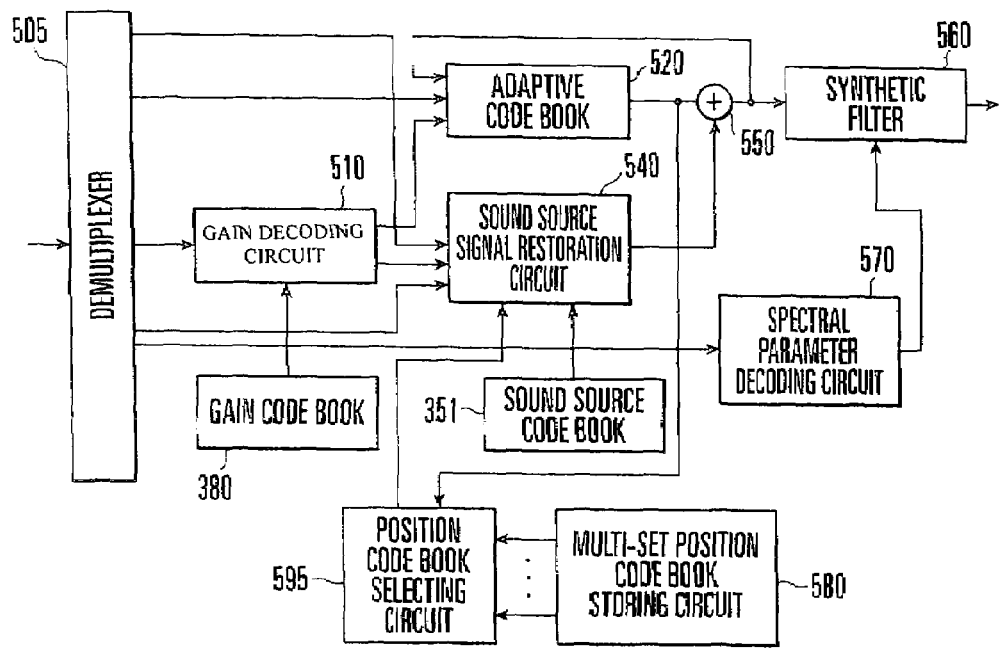
FIG. 4 is a block diagram showing an embodiment of a sound decoding apparatus of the present invention.

FIG. 4 is a block diagram showing an embodiment of a sound decoding apparatus of the present invention.

As shown in FIG. 4, this embodiment comprises a demultiplexer 505, gain decoding circuit 510, gain code book 380, adaptive code book 520, sound source signal restoration circuit 540, sound source code book 351, position code book selecting circuit 595, multi-set position code book storing circuit 580, adder 550, synthetic filter 560, and spectral parameter decoding circuit 570.

From a received signal, the demultiplexer 505 receives an index indicating a gain code vector, an index indicating a delay of an adaptive code book, information of a sound source signal, an index of a sound source code vector, and an index of a spectral parameter. The demultiplexer 505 demultiplexes and outputs these parameters.

The gain decoding circuit 510 receives the gain code vector index, reads out a gain code vector from the gain code book 380 in accordance with the index, and outputs the readout gain code vector.

The adaptive code book circuit 520 receives the adaptive code book delay to generate an adaptive code vector, multiplies the gain of the adaptive code book by the gain code vector, and outputs the result.

The position code book selecting circuit 595 receives a pitch prediction signal from the adaptive code book circuit 520, and temporally smoothes the signal. For this smoothed signal, the position code book selecting circuit 595 receives a plurality of sets of position code books 580. The position code book selecting circuit 595 calculates correlations with the smoothed signal for all pulse positions stored in each position code book, selects a position code book which maximizes the correlation, and outputs the selected position code book to the sound source restoration circuit 540.

The sound source signal restoration circuit 540 reads out the selected position code book from the position code book selecting circuit 595.

In addition, the sound source signal restoration circuit 540 generates a sound source pulse by using a polar code vector and gain code vector read out from the sound source code book 351, and outputs the generated sound source pulse to the adder 550.

The adder 550 generates a driving sound source signal v(n) on the basis of equation (17) by using the output from the adaptive code book circuit 520 and the output from the sound source restoration circuit 580, and outputs the signal to the adaptive code book circuit 520 and synthetic filter circuit 560.

The spectral parameter decoding circuit 570 decodes and converts a spectral parameter into a liner prediction coefficient, and outputs the linear prediction coefficient to the synthetic filter circuit 560.

The synthetic filter circuit 560 receives the driving sound source signal v(n) and linear prediction coefficient, and calculates and outputs a reproduction signal.

Fifth Embodiment

Figure 5:
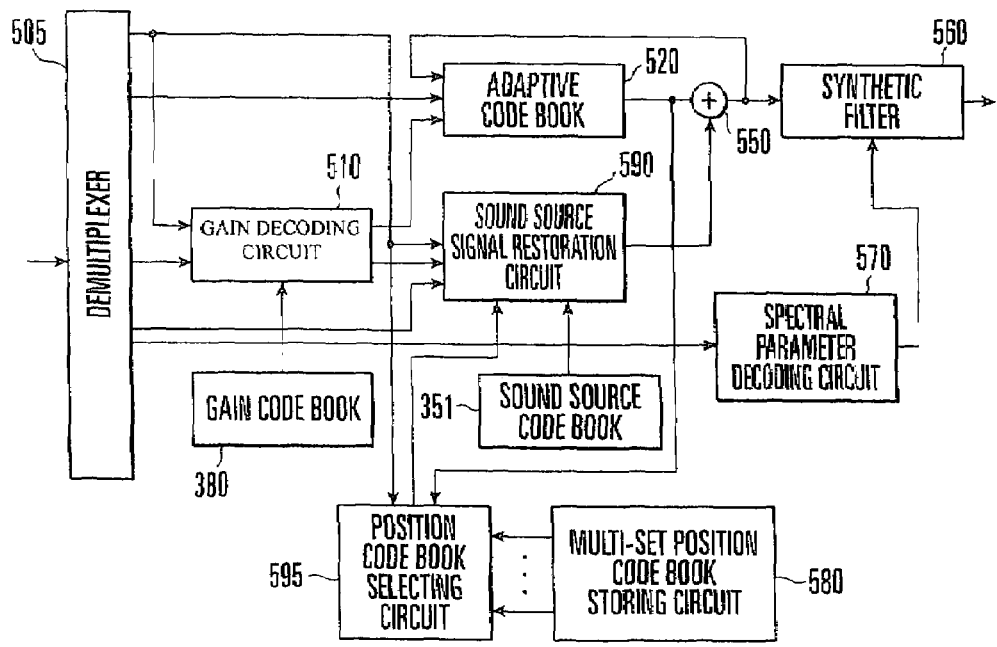
FIG. 5 is a block diagram showing another embodiment of the sound decoding apparatus of the present invention.

FIG. 5 is a block diagram showing another embodiment of the sound decoding apparatus of the present invention.

In this embodiment, the same reference numerals as in FIG. 4 denote the same constituent elements, and an explanation thereof will be omitted.

A sound source signal restoration circuit 590 receives mode discrimination information. If this mode discrimination information is mode 1, the sound source signal restoration circuit 590 reads out a selected position code book from a position code book selecting circuit 595. Also, the sound source signal restoration circuit 590 generates a sound source pulse by using a polar code vector and gain code vector read out from a sound source code book 351, and outputs the generated sound source pulse to an adder 550. If the mode discrimination information is mode 0, the sound source signal restoration circuit 590 generates a sound source pulse by using a predetermined pulse position set and gain code vector, and outputs the generated sound source pulse to the adder 550.

In the above embodiments, a plurality of sets of position code books indicating pulse positions are used. On the basis of a pitch prediction signal obtained by an adaptive code book, one type of position code book is selected from the plurality of position code books. A position at which distortion of a sound signal is minimized is searched for on the basis of the selected position code book. Therefore, the degree of freedom of pulse position information is higher than that of the conventional system. This makes it possible to provide a sound encoding system by which the sound quality is improved compared to the conventional system especially when the bit rate is low.

Also, on the basis of the pitch prediction signal obtained by the adaptive code book, one type of position code book is selected from the plurality of position code books, and gain code vectors stored in a gain code book are searched for with respect to individual positions stored in the position code book. Distortion of a sound signal is calculated in the state of a final reproduction signal, and a combination of a position and gain code vector by which this distortion is decreased is selected. Therefore, distortion can be decreased on the final reproduction sound signal containing the gain code vector. So, a sound encoding system which further improves the sound quality can be provided.

Furthermore, if a received discrimination code indicates a predetermined mode, one type of position code book is selected from the plurality of position code books on the basis of the pitch prediction signal obtained by the adaptive code book. Pulses are generated by using codes representing positions stored in the position code book, and are multiplied by a gain, thereby reproducing a sound signal through a synthetic filter. Accordingly, a sound decoding system which improves the sound quality compared to the conventional system when the bit rate is low can be provided.

From the foregoing, it is possible to provide a sound encoding apparatus and method capable of encoding a sound signal while suppressing deterioration of the sound quality with a small amount of calculations, and a sound decoding apparatus and method capable of decoding, with high quality, a sound signal encoded by the sound encoding apparatus and method.

What is claimed is:

1. A sound encoding apparatus having spectral parameter calculating means for receiving a sound signal and calculating a spectral parameter, spectral parameter quantizing means for quantizing the spectral parameter calculated by said parameter calculating means and outputting the quantized spectral parameter, impulse response calculating means for converting the output spectral parameter from said spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising:

position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

position code book selecting means for selecting one type of code book from said plurality of types of position code books on the basis of at least one of the delay and gain of said adaptive code book, said sound source quantizing means calculating a distortion of the sound signal by using the impulse pulse response for each of all combinations of positions that a plurality of pulses contained in the thus selected position code book can take respectively, and quantizing a pulse position by selecting a combination of positions at which the distortion is decreased; and multiplexer means for combining an output from said spectral parameter quantizing means, an output from said adaptive code book means, and an output from said sound source quantizing means, and outputting the combination.

2. The sound encoding apparatus according to claim 1, wherein said position code books all contain identical pulses in common.

3. The sound encoding apparatus according to claim 1, wherein said sound source quantizing means calculates said distortion of the sound signal for each of all combinations of the positions that the plurality of pulses contained in the selected position code book can take respectively and the respective pulse code vectors stored in a sound source code book, and selects such a combination of a position and a polar code vector that decreases said distortion.

4. A sound encoding apparatus having spectral parameter calculating means for receiving a sound signal and calculating a spectral parameter, spectral parameter quantizing means for quantizing the spectral parameter calculated by said parameter calculating means and outputting the quantized spectral parameter, impulse response calculating means for converting the output spectral parameter from said spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising:

position code book storing means for storing a plurality of types of position code books each containing an identical set of pulse positions, each of said types of position code books providing a different association of a plurality of said pulses with a subset of pulse positions within said identical set of pulse position that is different from associations between said pulses and said subsets of pulse positions in the remaining types of position code books;

position code book selecting means for selecting one type of code book from said plurality of types of position code books on the basis of at least one of the delay and gain of said adaptive code book, said sound quantizing means calculating a distortion of the sound signal by using the impulse response for each of all combinations of positions that a plurality of pulses contained in the thus selected position code book can take respectively, selecting a combination of positions at which the distortion is decreased, reading out a gain code vector stored in a gain code book for each position in the thus selected combination of positions to quantize the gain to thereby recalculate said distortion of the sound signal, and selectively outputting one type of combination of a position and gain code vector by which the distortion is decreased; and multiplexer means for combining an output from said spectral parameter quantizing means, an output from said adaptive code book means, and an output from said sound source quantizing means, and outputting the combination.

5. A sound encoding apparatus having spectral parameter calculating means for receiving a sound signal and calculating a spectral parameter, spectral parameter quantizing means for quantizing the spectral parameter calculated by said parameter calculating means and outputting the quantized spectral parameter, impulse response calculating means for converting the output spectral parameter from said spectral parameter quantizing means into an impulse response, adaptive code book means for obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and sound source quantizing means for quantizing the sound source signal and gain of the sound signal by using the impulse response, and outputting the quantized sound source signal and gain, comprising:

position code book storing means for storing a plurality of types of position code books, each containing an identical set of pulse positions, each of said types of position code books providing a different association of a plurality of a said pulses with a subset of pulse positions within said identical set of pulse positions that is different from associations between said pulses and said subsets of pulse positions in the remaining types of position code books;

discriminating means for extracting a feature from the sound signal and discriminating and outputting a mode;

position code book selecting means for selecting one type of code book from said plurality of types of position code books on the basis of at least one of the delay and gain of said adaptive code book, if an output from said discriminating means is a predetermined mode, said sound source quantizing means calculating a distortion of the sound signal by using the impulse response for each of all combinations of positions that a plurality of pulses contained in the thus selected position code book can take respectively, said sound source quantizing means calculating distortion of the sound signal by using the impulse response with respect to a position stored in the selected code bookif the output from said discriminating means is the predetermined mode, and quantizing a pulse position by selected a combination of positions at which the distortion is decreased; and multiplexer means for combining an output from said spectral parameter quantizing means, an output from said adaptive code book means, an output from said sound source quantizing means, and the output from said discriminating means, and outputting the combination.

6. A sound decoding apparatus comprising:

demultiplexer means for receiving a code concerning a spectral parameter, a code concerning an adaptive code book, a code concerning a sound source signal, and a code representing a gain, and demultiplexing these codes;

adaptive code vector generating means for generating an adaptive code vector by using the code concerning an adaptive code book;

position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

position code book selecting means for selecting one type of code book from said plurality of types of position code books on the basis of at least one of a delay and gain of said adaptive code book;

sound source signal restoring means for generating a pulse having a non-zero amplitude with respect to the position code book selected by said code book selecting means by using the codes concerning a code book and sound source signal, and generating the sound source signal by multiplying the pulse by a gain by using the code representing the gain; and synthetic filter means formed by a spectral parameter to receive the sound source signal and output a reproduction signal.

7. A sound decoding apparatus comprising:

demultiplexer means for receiving a code concerning a spectral parameter, a code concerning an adaptive code book, a code concerning a sound source signal, a code representing a gain, and a code representing a mode, and demultiplexing these codes;

adaptive code vector generating means for generating an adaptive code vector by using the code concerning an adaptive code book, if the code representing the mode is a predetermined mode;

position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

position code book selecting means for selecting one type of code book from said plurality of types of position code books on the basis of at least one of a delay and gain of said adaptive code book, if the code representing the mode is the predetermined mode;

sound source signal restoring means for generating, if the code representing the mode is the predetermined mode, a pulse having a non-zero amplitude with respect to the position code book selected by said code book selecting means by using the codes concerning a code book and sound source signal, and generating a sound source signal by multiplying the pulse by a gain by using the code representing the gain; and synthetic filter means formed by a spectral parameter to receive the sound source signal and output a reproduction signal.

8. A sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising:

preparing position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

the position code book selection step of selecting one type of code book from the plurality of types of position code books on the basis of at least one of the delay and gain of the adaptive code book;

the step of calculating a distortion of the sound signal by using the impulse response for each of all combinations of positions that a plurality of pulses contained in the thus selected position code book can take respectively, and quantizing a pulse position by selected a combination of positions at which the distortion is decreased in the sound source quantization step; and the multiplexing step of combining an output from the spectral parameter quantization step, an output from the adaptive code book step, and an output from the sound source quantization step, and outputting the combination.

9. The sound encoding method according to claim 8, wherein said position code books all contain identical pulses in common.

10. The sound encoding method according to claim 8, wherein said sound source quantizing means calculates said distortion of the sound signal for each of all combinations of the positions that the plurality of pulses contained in the selected position code book can take respectively and the respective pulse code vectors stored in a sound source code book, and selects such a combination of a position and a polar code vector that decreases said distortion.

11. A sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising:

preparing position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

the position code book selection step of selecting one type of code book from the plurality of types of position code books on the basis of at least one of the delay and gain of the adaptive code book;

the step of reading out a gain code vector stored in a gain code book for each position stored in the position code book selected in the position code book selection step, quantizing a gain to calculate distortion of the sound signal, and selectively outputting one type combination of a position and gain code vector by which the distortion is decreased, in the sound source quantization step; and the multiplexing step of combining an output from the spectral parameter quantization step, an output from the adaptive code book step, and an output from the sound source quantization step, and outputting the combination, wherein said sound source quantizing step further comprises: calculating a distortion of the sound signal by using the impulse response for each of all combinations of positions that a plurality of pulses contained in the thus selected position code book can take respectively, selecting a combination of positions at which the distortion is decreased, reading out a gain code vector stored in a gain code book for each position in the thus selected combination of positions to quantize the gain to thereby recalculate said distortion of the sound signal, and selectively outputting one type of combination of a position and gain code vector by which the distortion is decreased.

12. A sound encoding method having the spectral parameter calculation step of receiving a sound signal and calculating a spectral parameter, the spectral parameter quantization step of quantizing and outputting the spectral parameter, the impulse response calculation step of converting the quantized spectral parameter into an impulse response, the adaptive code book step of obtaining a delay and gain from a past quantized sound source signal on the basis of an adaptive code book to predict a sound signal and obtain a residual signal, and outputting the delay and gain, a sound source signal of the sound signal being represented by a combination of pulses having non-zero amplitudes, and the sound source quantization step of quantizing the sound source signal and gain of the sound signal by using the impulse response, and outputting the quantized sound source signal and gain, comprising:

preparing position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books;

the discrimination step of extracting a feature from the sound signal and discriminating and outputting a mode;

the position code book selection step of selecting one type of code book from the plurality of types of position code books on the basis of at least one of the delay and gain of the adaptive code book, if an output from the discrimination step is a predetermined mode;

for each of all combinations of positions that a plurality of pulses contained in the thus selected position code book can take respectively, if the output from the discrimination step is the predetermined mode, and quantizing a pulse position by selecting a combination of positions at which the distortion is decreased, in the sound source quantization step; and the multiplexing step of combining an output from the spectral parameter quantization step, an output from the adaptive code book step, an output from the sound source quantization step, and the output from the discrimination step, and outputting the combination.

13. A sound decoding method comprising:

the demultiplexing step of receiving a code concerning a spectral parameter, a code concerning an adaptive code book, a code concerning a sound source signal, and a code representing a gain, and demultiplexing these codes;

the adaptive code vector generation step of generating an adaptive code vector by using the code concerning an adaptive code book;

preparing position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books; the position code book selection step of selecting one type of code book from the plurality of sets of position code books on the basis of at least one of a delay and gain of the adaptive code book;

the sound source signal restoration step of generating a pulse having a non-zero amplitude with respect to the position code book selected in the code book selection step by using the codes concerning a code book and sound source signal, and generating a sound source signal by multiplying the pulse by a gain by using the code representing the gain; and the synthetic filtering step formed by a spectral parameter to receive the sound source signal and output a reproduction signal.

14. A sound decoding method comprising:

the demultiplexing step of receiving a code concerning a spectral parameter, a code concerning an adaptive code book, a code concerning a sound source signal, a code representing a gain, and a code representing a mode, and demultiplexing these codes;

the adaptive code vector generation step of generating an adaptive code vector by using the code concerning an adaptive code book, if the code representing the mode is a predetermined mode;

preparing position code book storing means for storing a plurality of types of position code books, each containing an identical set of pulse positions, each of said types of position code books providing a different association of a plurality of said pulses with a subset of pulse positions within said identical set of pulse positions that is different from associations between said pulses and said subsets of pulse positions in the remaining types of position code books; the position code book selection step of selecting one type of code book from the plurality of sets of position code books on the basis of at least one of a delay and gain of the adaptive code book, if the code representing the mode is the predetermined mode;

the sound source signal restoration step of generating, if the code representing the mode is the predetermined mode, a pulse having a non-zero amplitude with respect to the position code book selected in the code book selection step by using the codes concerning a code book and sound source signal, and generating a sound source signal by multiplying the pulse by a gain by using the code representing the gain; and the synthetic filtering step formed by a spectral parameter to receive the sound source signal and output a reproduction signal.

* * * * *